(12) United States Patent
Seo et al.

(10) Patent No.: US 11,500,728 B2
(45) Date of Patent: Nov. 15, 2022

(54) STORAGE CONTROLLER AND METHOD OF RESTORING ERROR OF THE SAME

(71) Applicant: SAMSUNG ELECTRONICS CO., LTD., Suwon-si (KR)

(72) Inventors: Jinho Seo, Seongnam-si (KR); Sanghyun Eom, Busan (KR); Taecjun Kim, Seoul (KR); Jinwoo Jung, Seoul (KR); Eunsik Choi, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/374,389

(22) Filed: Jul. 13, 2021

(65) Prior Publication Data

US 2022/0171683 A1 Jun. 2, 2022

(30) Foreign Application Priority Data

Nov. 27, 2020 (KR) .................. 10-2020-0162164

(51) Int. Cl.
*G06F 11/00* (2006.01)
*G06F 11/14* (2006.01)
*G06F 9/4401* (2018.01)
*G06F 11/07* (2006.01)

(52) U.S. Cl.
CPC ........ *G06F 11/1441* (2013.01); *G06F 9/4418* (2013.01); *G06F 11/0727* (2013.01); *G06F 11/0793* (2013.01); *G06F 11/1469* (2013.01); *G06F 2201/82* (2013.01)

(58) Field of Classification Search
CPC . G06F 11/073; G06F 11/0793; G06F 11/1441
See application file for complete search history.

(56) References Cited

U.S. PATENT DOCUMENTS

| 8,484,542 | B2 | 7/2013 | D'Abreu et al. |
| 8,806,297 | B2 | 8/2014 | D'Abreu et al. |
| 9,086,998 | B2 | 7/2015 | Dodson et al. |
| 9,626,106 | B2 | 4/2017 | Hsu et al. |
| 9,779,016 | B1 | 10/2017 | Shen et al. |

(Continued)

FOREIGN PATENT DOCUMENTS

KR 10-1394596 B1 5/2014

*Primary Examiner* — Michael Maskulinski
(74) *Attorney, Agent, or Firm* — Lee IP Law, P.C.

(57) ABSTRACT

A storage controller includes a host interface configured to perform communication with a host device, a memory interface configured to perform communication with a nonvolatile memory device, a higher-level controller, and a lower-level controller. The higher-level controller issues operations to be performed by the nonvolatile memory device based on requests transferred through the host interface. The lower-level controller includes an operation memory configured to store an operation code and operation data. The lower-level controller controls the memory interface based on the operation code and the operation data such that the nonvolatile memory device performs issued operations received from the higher-level controller. The higher-level controller performs, when an error occurs in the lower-level controller, an error restoring operation based on state information of the lower-level controller to restore the lower-level controller to a previous state corresponding to a state before the error occurs.

20 Claims, 17 Drawing Sheets

(56) References Cited

U.S. PATENT DOCUMENTS

| | | |
|---|---|---|
| 10,372,558 B2 | 8/2019 | Park et al. |
| 10,503,600 B2 | 12/2019 | Hsu et al. |
| 10,540,219 B2 | 1/2020 | Tomlin |
| 2020/0110662 A1 | 4/2020 | Kuo et al. |
| 2021/0149796 A1* | 5/2021 | Nam .................... G06F 13/1668 |

* cited by examiner

FIG. 6

| ISSUED OPERATIONS | STATE | CLASSIFICATION |
|---|---|---|
| OP1 | AF | REISSUE OPERATION |
| OP2 | DN | COMPLETED OPERATION |
| OP3 (ERROR) | AF | REISSUE OPERATION |
| OP4 | AF | REISSUE OPERATION |
| OP5 | BF | CANCEL OPERATION |
| OP6 | BF | CANCEL OPERATION |

FIG. 8

| ISSUED OPERATIONS | STATE | CLASSIFICATION |
|---|---|---|
| OP1 | AF | CANCEL OPERATION |
| OP2 | DN | COMPLETED OPERATION |
| OP3 (ERROR) | AF | REISSUE OPERATION |
| OP4 | AF | CANCEL OPERATION |
| OP5 | BF | CANCEL OPERATION |
| OP6 | BF | CANCEL OPERATION |

FIG. 11

| ISSUED OPERATIONS | SUB OPERATIONS | STATE | CLASSIFICATION |
|---|---|---|---|
| OP1 | OP11 | DN | COMPLETED SUB OPERATION |
| | OP12 | BF | REISSUE SUB OPERATION |
| OP2 | OP21 | DN | COMPLETED SUB OPERATION |
| | OP22 (ERROR) | AF | REISSUE SUB OPERATION |
| | OP23 | BF | REISSUE SUB OPERATION |
| OP3 | OP31 | BF | CANCEL SUB OPERATION |
| | OP32 | BF | CANCEL SUB OPERATION |

STORAGE CONTROLLER AND METHOD OF RESTORING ERROR OF THE SAME

CROSS-REFERENCE TO RELATED APPLICATION

Korean Patent Application No. 10-2020-0162164, filed on Nov. 27, 2020 in the Korean Intellectual Property Office, and entitled: "Storage Controller and Method of Restoring Error of the Same," is incorporated by reference herein in its entirety.

BACKGROUND

1. Field

Example embodiments relate generally to semiconductor integrated circuits, and more particularly to a storage controller and a method of restoring error of a storage controller.

2. Description of the Related Art

Semiconductor memory devices may be classified into volatile memory devices and non-volatile memory devices. Volatile memory devices, such as dynamic random access memory (DRAM) devices, static random access memory (SRAM) devices, etc., may lose the stored data when power is off. Non-volatile memory devices, such as flash memory devices, ferroelectric random access memory (FRAM) devices, phase-change random access memory (PRAM) devices, magnetic random access memory (MRAM) devices, etc., may maintain stored data even though power is off. Particularly, the non-volatile memory devices such as the flash memory may have advantages of rapid programming speed, low power consumption, large memory capacity, etc., and thus are widely used as storage media in various fields that demand low power and large capacity storage devices such as MP3 players, digital cameras, Solid State Drives (SSDs), embedded multimedia cards (eMMCs), computing systems, etc.

A storage controller to controlling the nonvolatile memory device includes various components. If an error occurs in one the components, data stored in the nonvolatile memory device may be lost and/or fatal damage may be caused in a storage system.

SUMMARY

Embodiments are directed to a storage controller, including: a host interface configured to perform communication with a host device; a memory interface configured to perform communication with a nonvolatile memory device; a higher-level controller configured to issue operations to be performed by the nonvolatile memory device based on requests transferred through the host interface; and a lower-level controller including an operation memory configured to store an operation code and operation data, the lower-level controller configured to control the memory interface based on the operation code and the operation data such that the nonvolatile memory device performs issued operations received from the higher-level controller. The higher-level controller may be configured to perform, when an error occurs in the lower-level controller, an error restoring operation based on state information of the lower-level controller, the error restoring operation restoring the lower-level controller to a previous state corresponding to a state before the error occurred.

Embodiments are also directed to a method of restoring an error of a storage controller that includes a higher-level controller and a lower-level controller, the lower-level controller including an operation memory, which stores an operation code and an operation data, and being configured to control a memory interface, which performs communication with a nonvolatile memory device, based on the operation code and the operation data such that the nonvolatile memory device performs issued operations received from the higher-level controller, the method including: generating, by the lower-level controller, an interrupt when an error occurs in the lower-level controller; suspending, by the higher-level controller, an operation of the lower-level controller in response to the interrupt from the lower-level controller, and storing state information of the lower-level controller; and performing, by the higher-level controller, an error restoring operation based on the state information of the lower-level controller, the error restoring operation that restores the lower-level controller to a previous state that corresponds to a state before the error occurs.

Embodiments are also directed to a method of restoring an error of a storage controller including a higher-level controller and a lower-level controller, the lower-level controller including an operation memory, which stores an operation code and an operation data, and being configured to control a memory interface, which performs communication with a nonvolatile memory device, based on the operation code and the operation data such that the nonvolatile memory device performs issued operations received from the higher-level controller, the method including: generating, by the lower-level controller, an interrupt when an error occurs in the lower-level controller; suspending, by the higher-level controller, an operation of the lower-level controller and an operation of the memory interface in response to the interrupt from the lower-level controller, and storing first state information of the lower-level controller and a second state information of the memory interface; and performing, by the higher-level controller, an error restoring operation based on the first state information of the lower-level controller and the second state information of the memory interface, the restoring operation restoring the lower-level controller and the memory interface to previous states corresponding to states before the error occurs.

BRIEF DESCRIPTION OF THE DRAWINGS

Features will become apparent to those of skill in the art by describing in detail example embodiments with reference to the attached drawings in which:

FIGS. 6 and 7 are diagrams illustrating an example of an error restoring operation of a higher-level controller included in a storage controller according to example embodiments.

FIGS. 8 and 9 are diagrams illustrating an example of an error restoring operation of a higher-level controller included in a storage controller according to example embodiments.

FIGS. 11 and 12 are diagrams illustrating an example of an error restoring operation of a higher-level controller included in a storage controller according to example embodiments.

DETAILED DESCRIPTION

Figure 1:
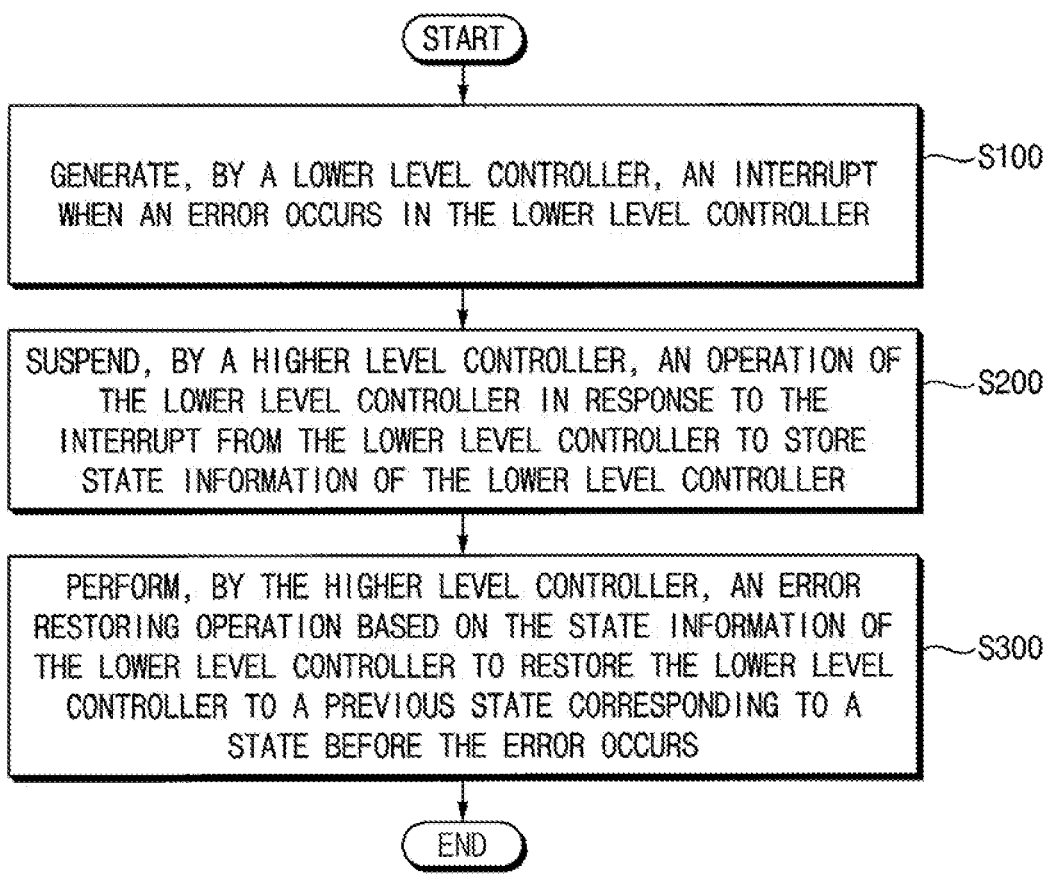
FIG. 1 is a flow chart illustrating a method of restoring error of a storage controller according to example embodiments.

FIG. 1 is a flow chart illustrating a method of restoring error of a storage controller according to example embodiments.

As described below with reference to FIGS. 2 and 3, a storage controller may include a higher-level controller and a lower-level controller. The lower-level controller may include an operation memory to store an operation code and an operation data, and may control a memory interface based on the operation code and the operation data such that a memory device, e.g., a nonvolatile memory device, may perform issued operations received from the higher-level controller.

Referring to FIG. 1, an interrupt may be generated by the lower-level controller when an error occurs in the lower-level controller (S100). An operation of the lower-level controller may be suspended by the higher-level controller in response to the interrupt from the lower-level controller to store state information of the lower-level controller (S200). An error restoring operation may be performed by the higher-level controller based on the state information of the lower-level controller to restore the lower-level controller to a previous state corresponding to a state before the error occurs.

The storage controller and the method of restoring error of a storage controller according to example embodiments may efficiently restoring error of the lower-level controller based on the state information of the lower-level controller, and efficiently restart the storage controller by resetting only the lower-level controller.

Before further describing example embodiments of the method of FIG. 1, a storage controller and a storage system including the storage controller according to example embodiments will now be described with reference to FIGS. 2 and 3.

Figure 2:
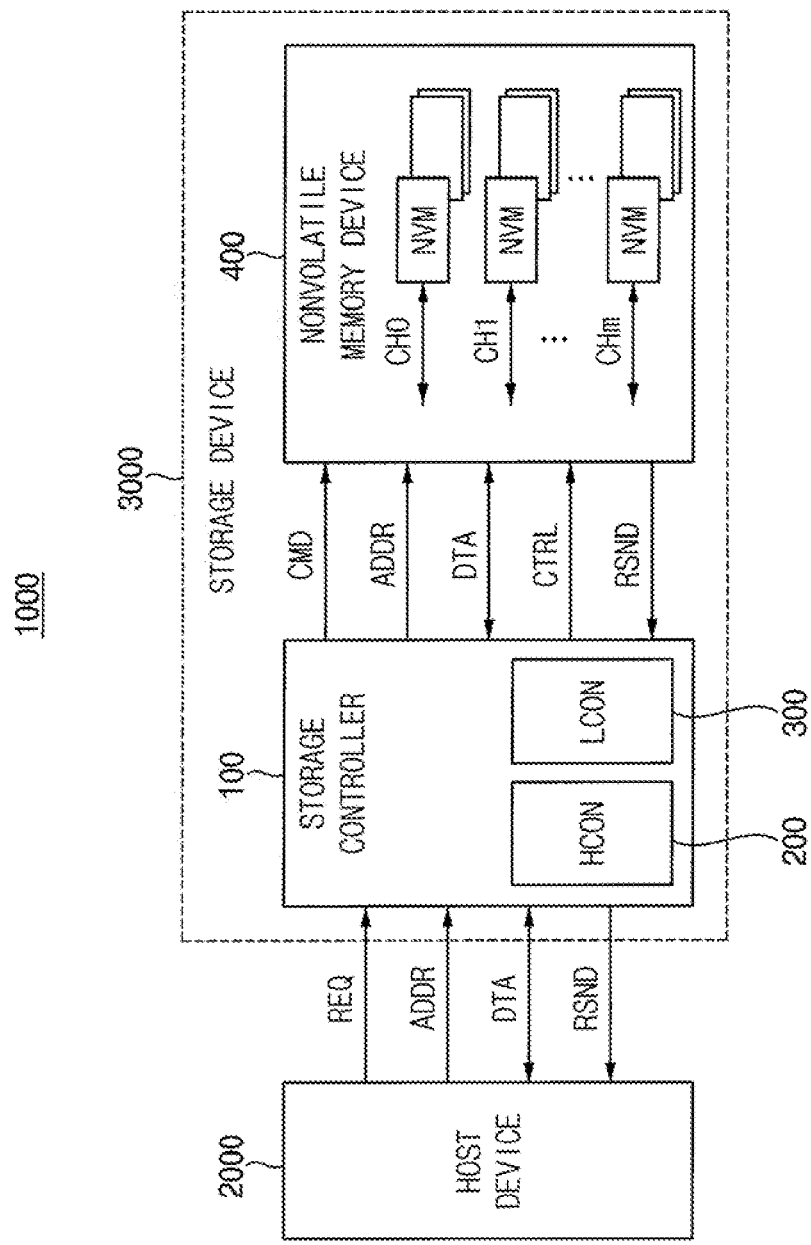
FIG. 2 is a block diagram illustrating a storage system according to example embodiments.

FIG. 2 is a block diagram illustrating a storage system according to example embodiments.

Referring to FIG. 2, a storage system 1000 may include a host device 2000 and a storage device 3000. The storage device 3000 may include a storage controller 100 and a nonvolatile memory device 400. For example, the storage device 3000 may be a solid state drive (SSD), an embedded multimedia card (eMMC), a universal flash storage (UFS), etc.

The host device 2000 may be or include a data processing device such as a central processing unit (CPU), a microprocessor, an application processor (AP), etc. The storage device 3000 may be embedded with the host device 2000 in an electronic device, or the storage device 3000 may be detachable to an electronic device including the host device 2000.

The host device 2000 may transfer a data operation request (which may be referred to herein as simply a request) REQ and an associated address ADDR to the storage controller 100 to communicate data DTA with the storage controller 100. The storage controller 100 may transfer a response RSND to the request REQ to the host device 2000. The data operation request REQ may include a read request, a program request, and/or an erase request, respectively associated with one or more read operations, program operations, and/or erase operations.

The storage controller 100 may control the nonvolatile memory device 400 based on the request REQ. The storage controller 100 may provide addresses ADDR, commands CMD, and control signals CTRL to perform the read operations, the program operations, and/or the erase operations. The program operation may be referred to as a write operation.

The storage controller 100 may control the nonvolatile memory device 400 to read data DTA stored in the nonvolatile memory device 400 in response to the read request received from the host device 2000. The storage controller 100 may control the nonvolatile memory device 400 to write or program data DTA in the nonvolatile memory device 400 in response to the write request received from the host device 2000. The storage controller 100 may control the nonvolatile memory device 400 to erase data stored in the nonvolatile memory device 400 in response to the erase request received from the host device 2000.

The storage controller 100 may include a higher-level controller HCON 200 and a lower-level controller LCON 300.

The higher-level controller 200 may issue operations to be performed in the nonvolatile memory device 400 based on the request REQ received from the host device 2000.

The lower-level controller 300 may include an operation memory to store an operation code and operation data. The lower-level controller 300 may control the nonvolatile memory device 400 based on the operation code and the operation data stored in the operation memory such that the nonvolatile memory device performs issued operations received from the higher-level controller 200.

As described below with reference to FIG. 3, the storage controller 100 may include a host interface configured to perform communication with the host device 2000, and may include a memory interface configured to perform communication with the nonvolatile memory device 400.

In some example embodiments, as described below with reference to FIGS. 6 through 9, when an error occurs in the lower-level controller 300, the higher-level controller 200 may perform an error restoring operation based on the state information of the lower-level controller 300 to restore the lower-level controller 300 to a previous state corresponding to a state before the error occurs in the lower-level controller 300.

In some example embodiments, as described below with reference to FIGS. 10 through 12, when an error occurs in the lower-level controller 300, the higher-level controller 200 may perform an error restoring operation based on state information of the memory interface in addition to the state information of the lower-level controller 300 to restore the lower-level controller 300 and the memory interface to previous states corresponding to states before the error occurs in the lower-level controller 300.

The nonvolatile memory device 400 may be implemented with nonvolatile memory such as flash memory, MRAM (Magnetic RAM), FeRAM (Ferroelectric RAM), PRAM (Phase change RAM), ReRAM (Resistive RAM), etc. The nonvolatile memory device 400 may be connected to the storage controller 100 through a plurality of channels CH0~CHm. Hereinafter, example embodiments will be described based on NAND flash memory but embodiments are not limited to a particular kind of memory.

Figure 3:
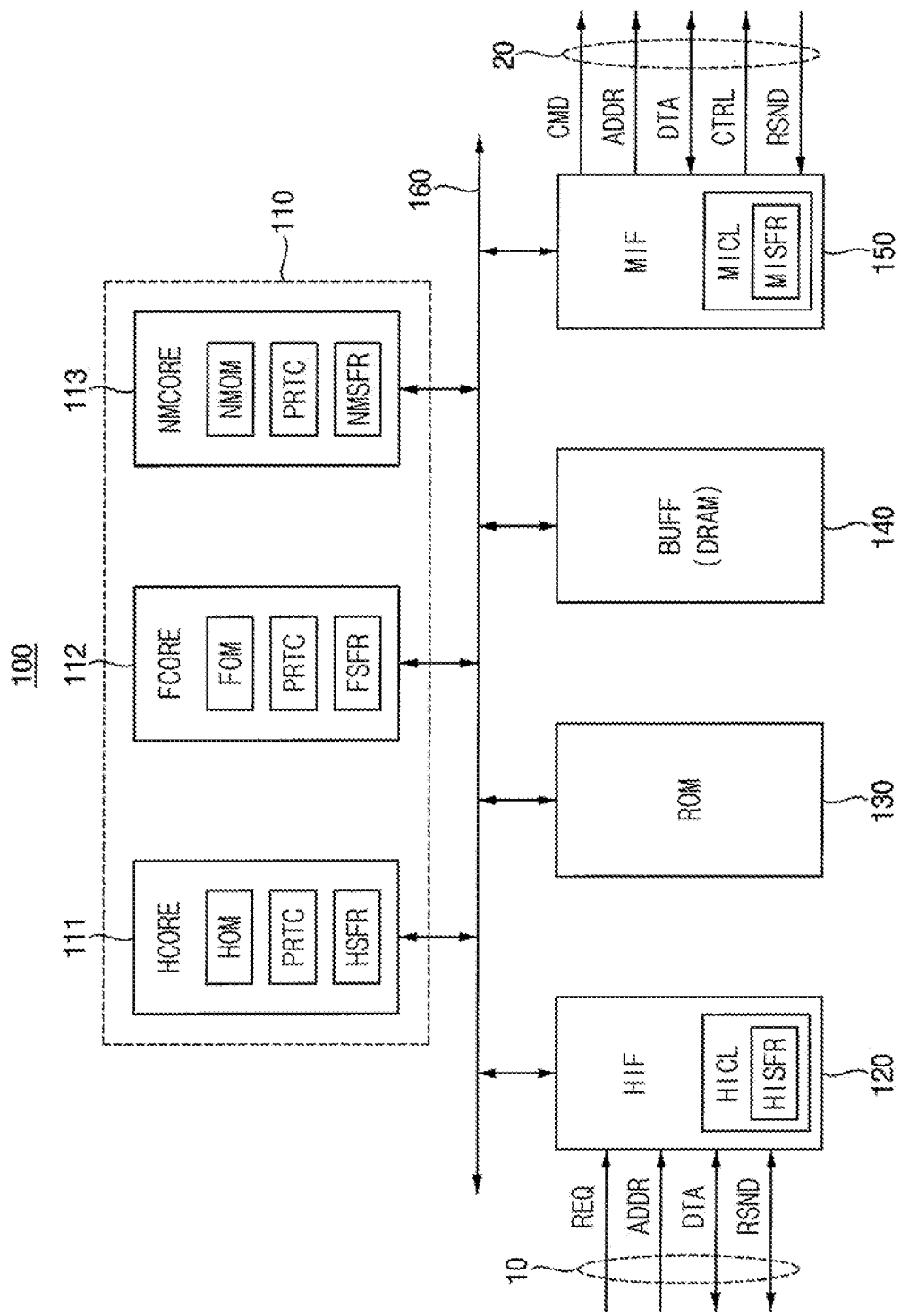
FIG. 3 is a block diagram illustrating a storage controller according to example embodiments.

FIG. 3 is a block diagram illustrating a storage controller according to example embodiments.

Referring to FIGS. 2 and 3, the storage controller 100 may include a control unit 110, a host interface HIF 120, a ROM (Read Only Memory) 130, an internal memory BUFF 140, a memory interface MIF 150, and an internal bus 160 electrically connecting the components in the storage controller 100.

The control unit 110 is described in detail below.

The host interface 120 may be connected to the host device 2000 through a bus, and may provide an interface between the storage controller 100 and the host device 2000. For example, the host interface 120 may exchange data with the storage controller 100 using one or more interface protocols, such as the universal serial bus (USB) protocol, multi-media card (MMC) protocol, peripheral component interconnection (PCI) protocol, PCI-express (PCI-E) protocol, advanced technology attachment (ATA) protocol, serial-ATA protocol, parallel ATA protocol, small computer small interface (SCSI) protocol, enhanced small disk interface (ESDI) protocol, integrated drive electronics (IDE) protocol, mobile industry processor interface (MIPI) protocol, universal flash storage (UFS) protocol, etc.

The host interface 120 may include a host interface control logic HICL to control transfer signals and data with respect to the host device 2000. The host interface control logic HICL may include a register HISFR that stores setting values to control the host interface 120 and state information corresponding to the present operation of the host interface 120.

The memory interface 150 may be connected to the nonvolatile memory device 400 through a bus 20, and may provide an interface between the storage controller 100 and the nonvolatile memory device 400. The bus 20 may be implemented with the plurality of channels CH0~CHm. Each of the channels CH0~CHm may communicate independently with the nonvolatile memory device 400. In some example embodiments, the memory interface 150 may be configured to comply with a standard protocol, such as Toggle or open NAND flash interface (ONFI).

The memory interface 150 may include a memory interface control logic MICL to control transfer signals and data with respect to the nonvolatile memory device 400. The memory interface control logic MICL may include a register MISFR that stores setting values to control the memory interface 150 and state information corresponding to the present operation of the memory interface 150.

The ROM 130 may store code and data used to drive the storage controller 100. The internal memory 140 may buffer and store write data transferred from the host device 2000 and read data transferred from the nonvolatile memory device 400. The code and the data to drive the storage controller 100 may be loaded from the ROM 130 to the internal memory 140 during an initialization process or a booting process, and/or meta data stored in the nonvolatile memory device 400 may be loaded to the internal memory 140.

FIG. 3 illustrates the ROM 130 and the internal memory 140 included in the storage controller 100 but embodiments are not limited thereto. In some example embodiments, the ROM 130 and/or the internal memory 140 may be disposed outside the storage controller 100. In some example embodiments, the internal memory 140 may be implemented with DRAM (dynamic random access memory).

The control unit 110 may control overall operation of the storage controller 100. The control unit 110 may include a CPU, a microprocessor, etc., to run firmware for controlling the storage controller 100.

The control unit 110 may include a plurality of processor cores or a plurality of controllers. In some example embodiments, the control unit 110 may include a host core HCORE 111, a Flash Translation Layer (FTL) core 112 (FCORE) and a NAND Manager (NM) core 113 (NMCORE). Herein, the FTL core 112 may be referred to as a higher-level controller and may correspond to HCON 200 of FIG. 2, and the NM core 113 may be referred to as a lower-level controller and may correspond to LCON 300 of FIG. 2.

The host core 111, the FTL core 112, and the NM core 113 may be implemented with distinct processor cores.

The host core 111 may receive a request set from the host interface 120. The host core 111 may parse the request set, and transfer each request to the corresponding core.

The host core 111 may include an operation memory HOM, a parity logic PTRC, and a register HSFR. The parity logic PTRC may generate parity bits corresponding to an operation code and operation data to drive the host core 111, and may store the parity bits with the operation code and the operation data in the operation memory HOM. The register HSFR may store setting values to control the operation of the host core 111, and may store state information indicating the present operation of the host core 111.

The FTL core 112 may control the NM core 113 based on the requests REQ received from the host core 111 such that the operations (such as the read operation, the program operation, the erase operation, etc.) may be performed in the nonvolatile memory device 400.

The FTL core 112 may include an operation memory FOM, a parity logic PTRC, and a register FSFR. The parity logic PTRC may generate parity bits corresponding to an operation code and operation data to drive the FTL core 112, and may store the parity bits with the operation code and the operation data in the operation memory FOM. The register FSFR may store setting values to control the operation of the FTL core 112, and may store state information indicating the present operation of the FTL core 112.

The NM core 113 may control the memory interface 150 under the control of the FTL core 112 such that the operations with respect to the nonvolatile memory device 400 may be performed.

The NM core 113 may include an operation memory NMOM, a parity logic PTRC, and a register NMSFR. The parity logic PTRC may generate parity bits corresponding to an operation code and operation data to drive the NM core 113, and may store the parity bits with the operation code and the operation data in the operation memory NMOM. The register NMSFR may store setting values to control the operation of NM core 113, and may store state information indicating the present operation of the NM core 113.

The operation codes and the operation data to drive the host core 111, the FTL core 112, and the NM core 113 may be loaded from the ROM 130 and/or the nonvolatile memory device 400 to the internal memory 140 during the initialization process of the storage controller 100. Each of the host core 111, the FTL core 112, and the NM core 113 may load at least a portion of the operation code and the operation data from the internal memory 140, and may store the loaded code and data in the respective operation memories HOM, FOM, and NMOM. In some example embodiments, the operation code and the operation data may be loaded directly from the ROM 130 and/or the nonvolatile memory device 400 to the operation memories HOM, FOM, and NMOM. In some example embodiments, the operation memories HOM, FOM, and NMOM may be implemented with SRAM (static dynamic random access memory).

As described above, the FTL core 112 may issue the operations to be performed in the nonvolatile memory device 400 based on the requests REQ received through the host interface 120 from the host device 2000, and the NM core 113 may control the memory interface 150 based on the operation code and the operation data stored in the operation memory NMOM such that the nonvolatile memory device 400 may perform the issued operations received from the higher-level controller FCORE. In this case, the FTL core 112 corresponds to a processor core of a higher level than the NM core 113, and thus the FTL core 112 may be referred to as the higher-level controller FCORE and the NM core 113 may be referred to as the lower-level controller NMCORE.

In some example embodiments, as described below with reference to FIGS. 6 through 9, when an error occurs in the lower-level controller NMCORE, the higher-level controller FCORE may perform an error restoring operation based on the state information of the lower-level controller NMCORE to restore the lower-level controller NMCORE to a previous state corresponding to a state before the error occurs in the lower-level controller NMCORE.

In some example embodiments, as described below with reference to FIGS. 10 through 12, when an error occurs in the lower-level controller NMCORE, the higher-level controller FCORE may perform an error restoring operation based on the state information of the memory interface 150 in addition to the state information of the lower-level controller NMCORE to restore the lower-level controller NMCORE and the memory interface 150 to previous states corresponding to states before the error occurs in the lower-level controller NMCORE.

The parity logic PTRC of the lower-level controller NMCORE may perform a parity check with respect to the operation code or the operation data that are read from the operation memory NMOM, and may generate an interrupt when a parity error occurs by the parity check. The higher-level controller FCORE may suspend the operation of the lower-level controller NMCORE in response to the interrupt from the lower-level controller NMCORE, and may store the state information of the lower-level controller NMCORE and the state information of the memory interface 150. The state information of the lower-level controller NMCORE may include the values stored in the operation memory NMOM and the register NMSFR of the lower-level controller NMCORE at a time point when the operation of the lower-level controller NMCORE is suspended. The state information of the memory interface 150 may include the values stored in the register MISFR of the memory interface 150 at a time point when the operation of the memory interface 150 is suspended.

As such, the error restoring operation may be performed based on the state information of the lower-level controller NMCORE and the memory interface 150. Thus, only the lower-level controller NMCORE may be reset, and the higher-level controller FCORE may operates normally without reset.

Although not illustrated in FIG. 3, the storage controller 100 may further include an ECC (error check code) engine, a RAID (redundant array of independent disk) engine, an AES (advanced encryption standard) engine, a clock generator, etc. The ECC engine may perform an error correction function with respect to the write data to be written in the nonvolatile memory device 400 and the read data read from the nonvolatile memory device 400. The RAID engine may perform a function to divide the data corresponding to one stripe set and store the divided stripes in a plurality of regions of the nonvolatile memory device 400. The AES engine may perform at least one of an encryption operation and a decryption operation on the write data input to the nonvolatile memory device 400 and the read data output from the nonvolatile memory device 400, using a symmetric-key algorithm. The AES engine may include an encryption module and a decryption module. The encryption module and the decryption module may be implemented as separate modules, or one module capable of performing both encryption and decryption operations may be implemented in the AES engine. The clock generator may divide a frequency of an external clock signal to generate clock signals provided to respective components of the storage controller 100.

Figure 4:
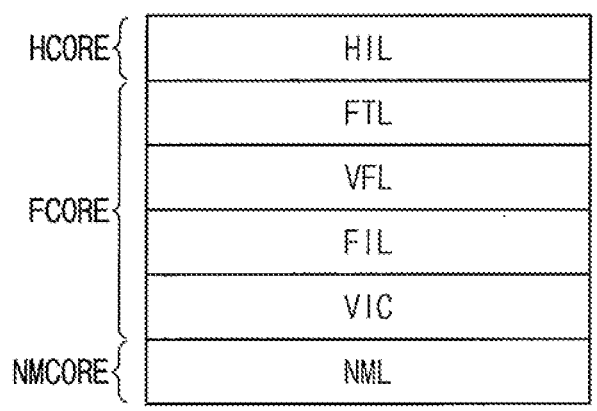
FIG. 4 is a diagram illustrating a hierarchical structure of firmware of a storage controller.

FIG. 4 is a diagram illustrating a hierarchical structure of the firmware of the storage controller.

Referring to FIGS. 3 and 4, the firmware of the storage controller 100 may include a host interface layer HIL, a flash translation layer FTL, a virtual flash layer VFL, a flash interface layer FIL, a virtual interrupt layer VIC, and a NAND manager (NM) layer NML.

When the request from the host device 2000 is received by the host interface 120, the host interface layer HIL (which is performed by the host core HCORE) may decode the request and store the decoded request in the register HISFR. The host interface layer HIL may receive the information stored in the register HISFR by a polling scheme or an interrupt scheme, and determine whether the received request is appropriate.

The flash translation layer FTL (which is performed by the higher-level controller FCORE) may map a logical block address (LBA) transferred from the host device 2000 to a physical block address (PBA) indicating a physical location of the nonvolatile memory device 400.

The NM layer NML (which is performed by the lower-level controller NMCORE) may control the operation of the memory interface 150. The virtual flash layer VFL and the flash interface layer FIL that are performed by the higher-level controller FCORE may control the operation of the lower-level controller NMCORE. The virtual flash layer VFL may manage bad block information of the nonvolatile memory device 400. The virtual interrupt layer VIC (which is performed by the higher-level controller FCORE) may manage exceptional events, e.g., exceptions, occurring in the lower-level controller NMCORE.

Example embodiments are associated with the virtual flash layer VFL, the flash interface layer FIL, the virtual interrupt layer VIC, and the NM layer NML. The firmware configuration of the storage controller 100 according to example embodiments is further described with reference to FIG. 5.

Figure 5:
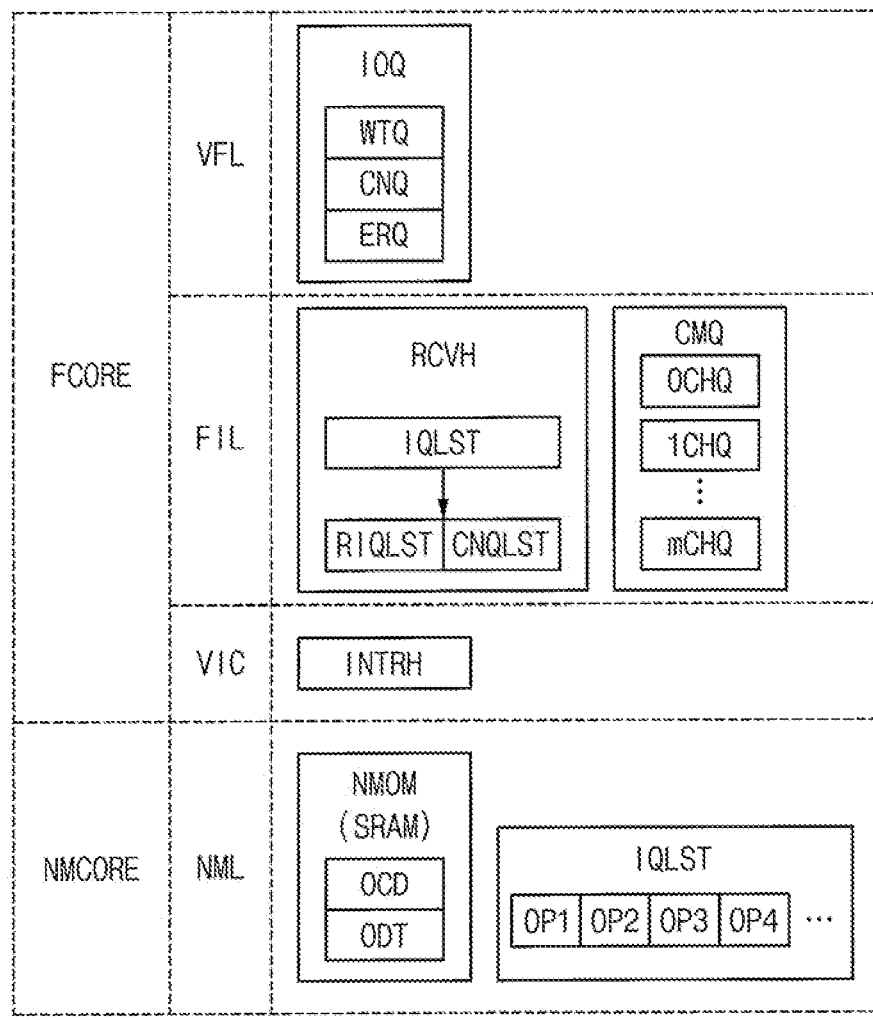
FIG. 5 is a diagram illustrating an example of firmware configuration of a higher-level controller and a lower-level controller included in a storage controller according to example embodiments.

FIG. 5 is a diagram illustrating an example of a firmware configuration of the higher-level controller and the lower-level controller included in a storage controller according to example embodiments.

Referring to FIGS. 3, 4, and 5, the NM layer NML of the lower-level controller NMCORE may include the operation code OCD, the operation data ODT, and an issued queue list IQLST including issued operations OP1~OP4, which are issued from the higher-level controller FCORE. The lower-level controller NMCORE may store the operation code OCD and the operation data ODT in the operation memory NMOM of the lower-level controller NMCORE, and may execute the stored operation code OCD. The issued queue list IQLST may be stored in the operation memory NMOM by updating a portion of the operation data ODT that are initially-loaded data.

As described above, the parity logic PTRC of the lower-level controller NMCORE may generate parity bits corresponding to an operation code and operation data to drive the NM core 113, and may store the parity bits with the operation code and the operation data in the operation memory NMOM. The parity logic PTRC of the lower-level controller NMCORE may perform a parity check with respect to the operation code or the operation data that are read from the operation memory NMOM, and may generate an interrupt when a parity error occurs by the parity check.

The virtual flash layer VFL of the higher-level controller FCORE may include an input-output queue IOQ. The input-output queue IOQ may include a wait queue WTQ, a cancel queue CNQ, and an error queue ERQ. The higher-level controller FCORE may store the input-output queue IOQ in the operation memory FOM of the higher-level controller FCORE and/or in the internal memory 140.

The wait queue WTQ may include wait operations that are to be transferred to the lower-level controller NMCORE. The cancel queue CNQ may include operations that are returned from the flash interface layer FIL. The error queue ERQ may include operations related with a bad block of the nonvolatile memory device 400. According to example embodiments, the wait queue WTQ and the cancel queue CNQ may be combined as one queue (not shown).

The flash interface layer FIL of the higher-level controller FCORE will be described in detail below.

The virtual interrupt layer VIC of the higher-level controller FCORE may include an interrupt handler INTRH. In some example embodiments, the higher-level controller FCORE may store the operation code and the operation data corresponding to the interrupt handler INTRH in the operation memory FOM of the higher-level controller FCORE, and may execute the stored operation code. In some example embodiments, the interrupt handler INTRH may be implemented as hardware that is distinct from the higher-level controller FCORE or included in the higher-level controller FCORE.

The interrupt handler INTRH of the virtual interrupt layer VIC may suspend the operations of the lower-level controller NMCORE and the memory interface 150 and the memory interface 150 in response to an interrupt generated by the lower-level controller NMCORE. The interrupt handler INTRH may store the state information of the lower-level controller NMCORE and the memory interface 150.

As described above, the state information of the lower-level controller NMCORE may include the values stored in the operation memory NMOM and the register NMSFR of the lower-level controller NMCORE at a time point when the operation of the lower-level controller NMCORE is suspended. The state information of the memory interface 150 may include the values stored in the register MISFR of the memory interface 150 at a time point when the operation of the memory interface 150 is suspended.

The flash interface layer FIL of the higher-level controller FCORE may include a recovery handler RCVH and a communication queue CMQ. The higher-level controller FCORE may store the operation code and the operation data corresponding to the recovery handler RCVH in the operation memory FOM of the higher-level controller FCORE, and may execute the stored operation code. The higher-level controller FCORE may store the communication queue CMQ in the operation memory FOM of the higher-level controller FCORE and/or in the internal memory 140.

The communication queue CMQ may include issue information on the issued operations that are transferred to the lower-level controller NMCORE. As described above, the nonvolatile memory device 400 may be connected to the memory interface 150 through the plurality of channels CH0~CHm that may communicate independently. In this case, the communication queue CMQ may include a plurality of sub queues 0CHQ~mCHQ respectively storing the issue information corresponding to the plurality of channels CH0~CHm.

The recovery handler RCVH may determine reissue operations and cancel operations, based on the issue information stored in the communication queue CMQ and the state information of the lower-level controller NMCORE.

The recovery handler RCVH may reconfigure the issued queue list IQLST, based on the issue information stored in the communication queue CMQ and the state information of the lower-level controller NMCORE. After the reconfiguration, the recovery handler RCVH may determine at least one reissue operation to be transferred again to the lower-level controller NMCORE among the issued operations and the cancel operations among the issued operations except the at least one reissue operation, based on the issue information stored in the communication queue CMQ and the state information of the lower-level controller NMCORE.

The recovery handler RCVH may store the reissue operations in a reissue queue list RIQLST, and may store the cancel operations in a cancel queue list CNQLST. The classification of the reissue operations and the cancel operations will be further described with reference to FIGS. 6 through 12.

The recovery handler RCVH may initialize the lower-level controller NMCORE and perform a reset operation to store the operation code and the operation data in the lower-level controller after the lower-level controller NMCORE is initialized. The recovery handler RCVH may transfer the reissue operations to the lower-level controller NMCORE after the reset operation is completed. The recovery handler RCVH may store the cancel operations of the cancel queue list CNQLST in the input-output queue IOQ. After that, the higher-level controller FCORE or the lower-level controller NMCORE may initialize the memory interface 150 and store, in the register MISFR of the memory interface 150, the setting values to control the operation of the memory interface 150 and the state information corresponding to the previous state. The previous state may indicate a state before the error occurs in the lower-level controller NMCORE, and the previous state may be a state corresponding to a first reissue operation that is to be performed after the reset operation.

As such, the reissue operations may be performed with respect to the nonvolatile memory device 400 after the reset operations are completed with respect to the lower-level controller NMCORE and the memory interface 150.

Figure 7:
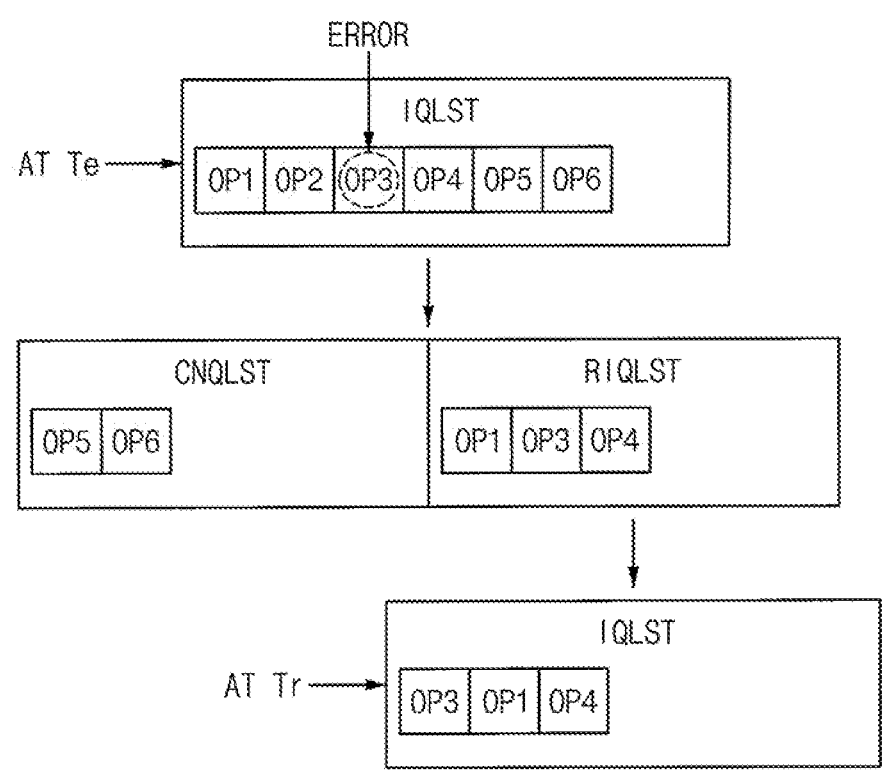

FIGS. 6 and 7 are diagrams illustrating an example of an error restoring operation of a higher-level controller included in a storage controller according to example embodiments.

FIGS. 6 and 7 illustrate an example in which the issued queue list IQLST of the lower-level controller NMCORE includes first through sixth issued operations OP1~OP6 at a time point when an error occurs in the lower-level controller NMCORE. In FIG. 6, a first state AF indicates a state after a corresponding issued operation is started with respect to the nonvolatile memory device 400, a second state BF indicates a state before a corresponding issued operation is started with respect to the nonvolatile memory device 400, and a third state DN indicates a state after a corresponding issued operation is completed. In FIG. 7, a first time point Te indicates a time point when an error occurs in the lower-level controller NMCORE and a second time point Tr indicates a time point after the reset operation of the lower-level controller NMCORE is completed by the recovery handler RCVH.

The higher-level controller FCORE may perform scheduling of the wait operations stored in the input-output queue IOQ, and may transfer the issued operations to the lower-level controller NMCORE in a proper order that is determined by the scheduling. For example, the first through sixth issued operations OP1~OP6 may be transferred sequentially in that order from the higher-level controller FCORE to the lower-level controller NMCORE.

In the present example, it is assumed that an error occurs in the lower-level controller NMCORE while the third issued operation OP3 is performed, and the second issued operation OP2 is completed before the error occurs.

Referring to FIGS. 3 through 7, at the first time point Te, the recovery handler RCVH may reconfigure the issued queue list IQLST of the lower-level controller NMCORE based on the issue information stored in the communication queue CMQ and the state information of the lower-level controller NMCORE and the memory interface 150 that are backed-up. The issued queue list IQLST may sequentially include the first through sixth issued operations OP1~OP6.

After that, the recovery handler RCVH may determine, as the reissue operations, the first, third, and fourth issued operations OP1, OP3, and OP4 corresponding to the first state AF among the first through sixth issued operations OP1~OP6 stored in the issued queue list IQLST at the first time point Te, based on the issue information stored in the communication queue CMQ and the state information of the lower-level controller NMCORE and the memory interface 150 that are backed-up. The recovery handler RCVH may determine, as the cancel operations, the fifth and sixth issued operations OP5 and OP6 corresponding to the second state BF.

After the reset operation of the lower-level controller NMCORE is completed, the recovery handler RCVH may transfer the first, third, and fourth issued operations OP1, OP3, and OP4 (which are determined as the reissue operations) to the lower-level controller NMCORE. The lower-level controller NMCORE may store the issued queue list IQLST at the second time point Tr. Here, the higher-level controller FCORE may transfer the third issued operation OP3 (in which the error occurred) first to the lower-level controller NMCORE, and the lower-level controller NMCORE may restart the communication with the nonvolatile memory device 400 starting from the third issued operation OP3. The recovery handler RCVH may store the fifth and sixth issued operations OP5 and OP6 (corresponding to the cancel operations of the cancel queue list CNQLST) in the input-output queue IOQ.

Figure 9:
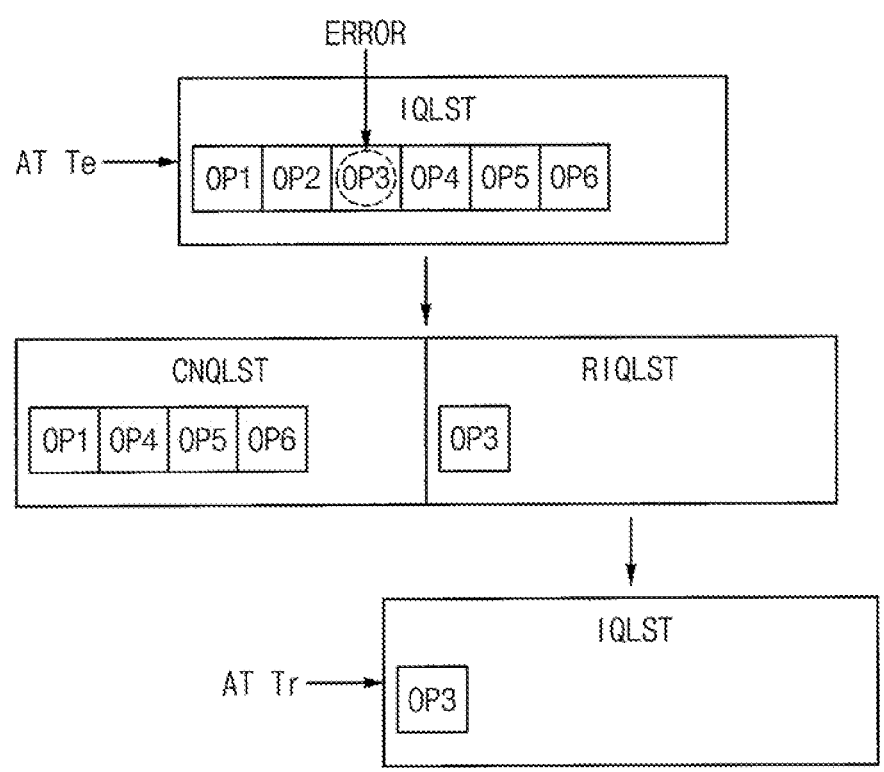

FIGS. 8 and 9 are diagrams illustrating an example of an error restoring operation of a higher-level controller included in a storage controller according to example embodiments. The example embodiments of the FIGS. 8 and 9 are similar to the example embodiments of FIGS. 6 and 7, and repeated descriptions are omitted.

Referring to FIGS. 3, 4, 5, 8, and 9, at the first time point Te, the recovery handler RCVH may reconfigure the issued queue list IQLST of the lower-level controller NMCORE based on the issue information stored in the communication queue CMQ and the state information of the lower-level controller NMCORE and the memory interface 150 that are backed-up. The issued queue list IQLST may sequentially include the first through sixth issued operations OP1~OP6.

After that, the recovery handler RCVH may determine, as the reissue operations, the third issued operations OP3 in which the error is occurred among the first through sixth issued operations OP1~OP6 stored in the issued queue list IQLST at the first time point Te, based on the issue information stored in the communication queue CMQ and the state information of the lower-level controller NMCORE and the memory interface 150 that are backed-up. The recovery handler RCVH may determine, as the cancel operations, the first, fourth, fifth, and sixth issued operations OP1, OP4, OP5, and OP6 except the third issued operation OP3 that is determined as the reissue operation and the second issued operation OP2 corresponding to the third state DN.

After the reset operation of the lower-level controller NMCORE is completed, the recovery handler RCVH may transfer the third issued operation OP3 determined as the reissue operations to the lower-level controller NMCORE, and the lower-level controller NMCORE may store the issued queue list IQLST at the second time point Tr. The recovery handler RCVH may store the first, fourth, fifth, and sixth issued operations OP1, OP4, OP5, and OP6 of the cancel queue list CNQLST in the input-output queue IOQ.

As described with reference to FIGS. 6 through 9, when an error occurs in the lower-level controller NMCORE, the storage controller 100 may operate normally starting from the issued operation in which the error is occurred using the error restoring operation of the higher-level controller FCORE.

A method of restoring error of a storage controller according to example embodiments may be completed within about 200 ms (millisecond), and user experience of the storage system 1000 including the storage device 3000 may be enhanced through the rapid recovery. In addition, by restoring the lower-level controller NMCORE to the previous state before the error is occurred, the data may be used, which in contrast would be unusable when an SRAM parity error of the lower-level controller NMCORE occurs in a general storage system.

Figure 10:
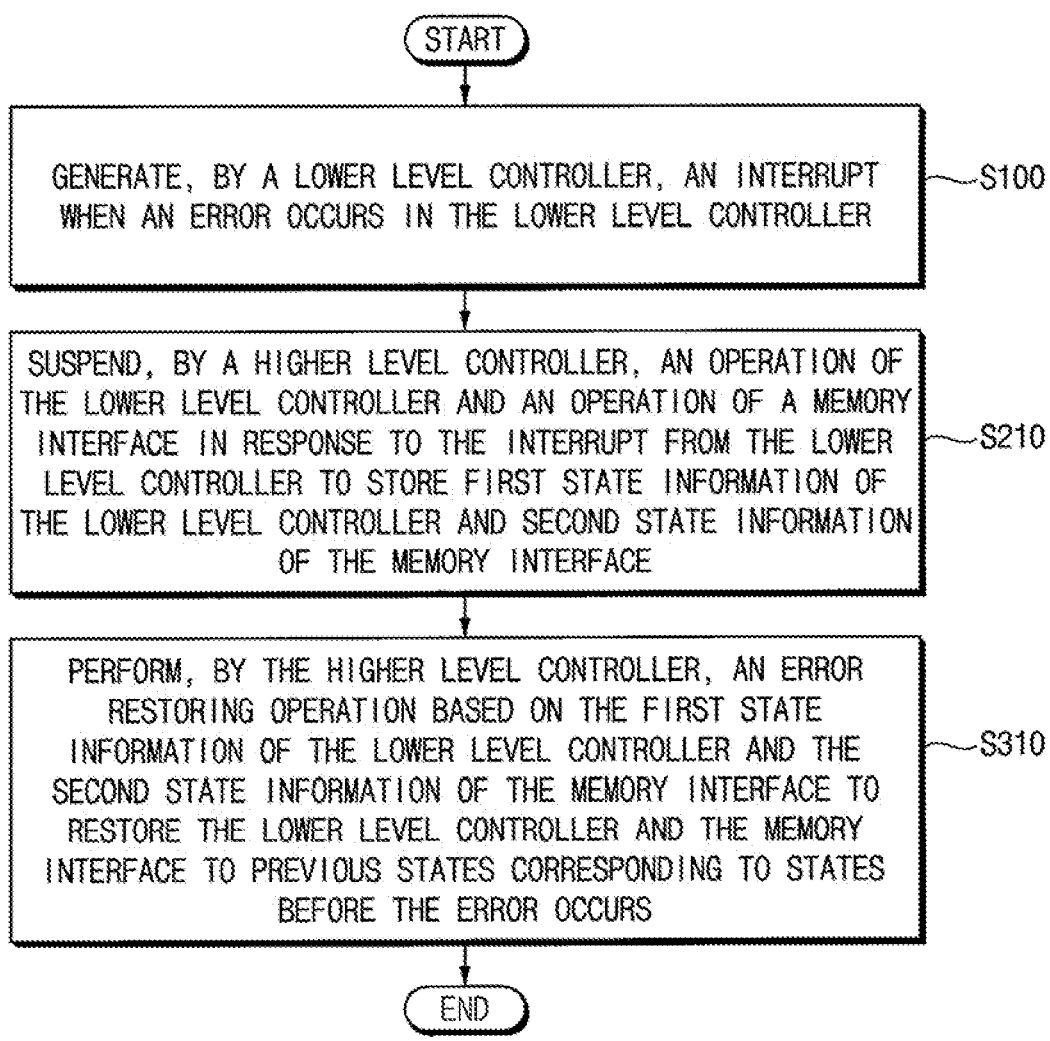
FIG. 10 is a flow chart illustrating a method of restoring error of a storage controller according to example embodiments.

FIG. 10 is a flow chart illustrating a method of restoring error of a storage controller according to example embodiments.

As described with reference to FIGS. 2 and 3, the storage controller may include a higher-level controller and a lower-level controller. The lower-level controller may include an operation memory to store an operation code and an operation data. The lower-level controller may control a memory interface based on the operation code and the operation data such that a nonvolatile memory device may perform issued operations received from the higher-level controller.

Referring to FIG. 10, an interrupt may be generated by the lower-level controller when an error occurs in the lower-level controller (S100). An operation of the lower-level controller and an operation of the memory interface may be suspended by the higher-level controller in response to the interrupt from the lower-level controller, to store first state information of the lower-level controller and second state information of the memory interface (S210). An error restoring operation may be performed by the higher-level controller based on the first state information of the lower-level controller and the second state information of the memory interface, to restore the lower-level controller and the memory interface to previous states corresponding to states before the error occurs (S310).

The storage controller and the method of restoring error of a storage controller according to example embodiments may efficiently restore an error of the lower-level controller based on the second state information of the memory interface in addition to the first state information of the lower-level controller, and may efficiently restart the storage controller by resetting only the lower-level controller. Also, as described below with reference to FIGS. 11 and 12, a stage in which an error occurs may be further subdivided.

Hereinafter, example embodiments are described with reference to FIGS. 11 and 12 when the issued operation in which the error is occurred corresponds to a multi-stage operation including a plurality of sub-operations to be performed sequentially by the nonvolatile memory device.

Figure 12:
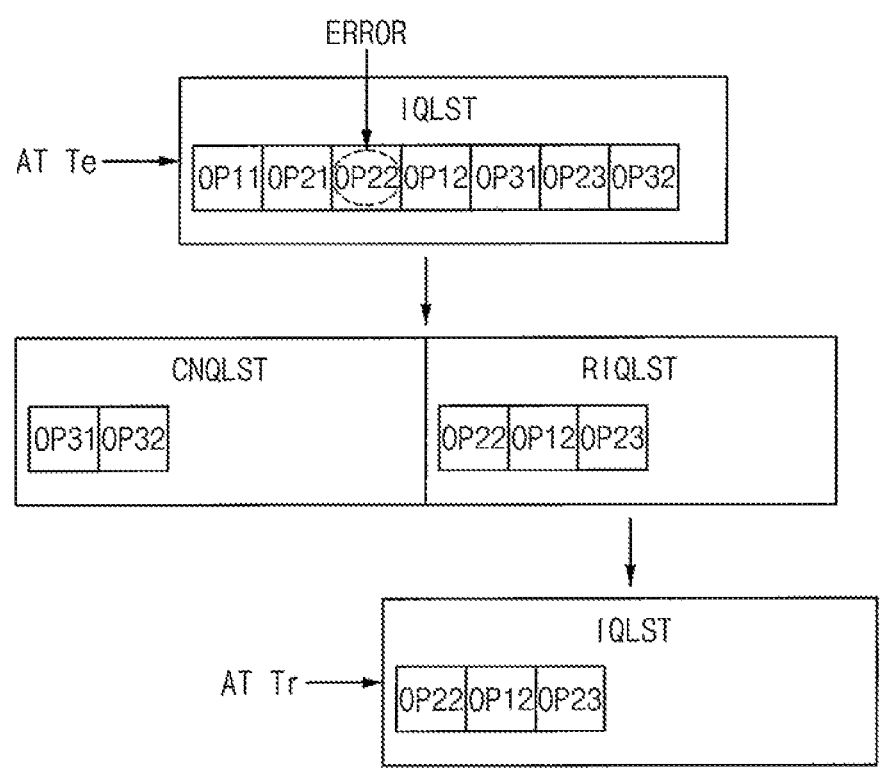

FIGS. 11 and 12 are diagrams illustrating an example of an error restoring operation of a higher-level controller included in a storage controller according to example embodiments.

FIGS. 11 and 12 illustrate an example in which the issued queue list IQLST of the lower-level controller NMCORE includes first through third issued operations OP1~OP3 at a time point when an error occurs in the lower-level controller NMCORE. In the present example, the first issued operation OP1 includes first and second sub-operations OP11 and OP12 that are to be performed sequentially in the nonvolatile memory device 400, the second issued operation OP2 includes third, fourth, and fifth sub-operations OP21, OP22, and OP23 that are to be performed sequentially in the nonvolatile memory device 400, and the third issued operation OP3 includes sixth and seventh sub-operations OP31 and OP32 that are to be performed sequentially in the nonvolatile memory device 400.

In FIG. 11, a first state AF indicates a state after a corresponding sub-operation is started with respect to the nonvolatile memory device 400, a second state BF indicates a state before a corresponding sub-operation is started with respect to the nonvolatile memory device 400, and a third state DN indicates a state after a corresponding sub-operation is completed. In FIG. 12, a first time point Te indicates a time point when an error occurs in the lower-level controller NMCORE and a second time point Tr indicates a time point after the reset operation of the lower-level controller NMCORE is completed by the recovery handler RCVH.

The higher-level controller FCORE may perform scheduling of the wait operations stored in the input-output queue IOQ, and may transfer the issued operations to the lower-level controller NMCORE in a proper order that is determined by the scheduling. For example, the first sub-operation OP11, the third sub-operation OP21, the fourth sub-operation OP22, the second sub-operation OP12, the sixth sub-operation OP31, the fifth sub-operation OP23, and the seventh sub-operation OP32 may be transferred sequentially in that order from the higher-level controller FCORE to the lower-level controller NMCORE.

As such, before all sub-operations of one issued operation are completed, a sub-operation of another issued operation may be started. For example, referring to FIG. 12, the third sub-operation OP21 of the second issued operation OP2 may be started before the second sub-operation OP12 corresponding to the last sub-operation of the first issued operation OP1, depending on the scheduling of the higher-level controller FCORE.

Such interleaving of the sub-operations may be implemented, e.g., when the nonvolatile memory device 400 is divided to a plurality of channels and the issued operations correspond to different channels, or when the nonvolatile memory device 400 supports per-plain operation and the issued operations correspond to different memory plains.

In the present example, it is assumed that an error occurs in the lower-level controller NMCORE while the fourth sub-operation OP22 in the second issued operation OP2 is performed, and the first sub-operation OP11 in the first issued operation OP1 and the third sub-operation OP21 in the second issued operation OP2 are completed before the error occurs. The fourth sub-operation OP22 in which the error occurs is also referred to as a target sub-operation.

Referring to FIGS. 3, 4, 5, 11, and 12, at the first time point Te, the recovery handler RCVH may reconfigure the issued queue list IQLST of the lower-level controller NMCORE based on the issue information stored in the communication queue CMQ and the state information of the lower-level controller NMCORE and the memory interface 150 that are backed-up. The issued queue list IQLST may sequentially include the first sub-operation OP11, the third sub-operation OP21, the fourth sub-operation OP22, the second sub-operation OP12, the sixth sub-operation OP31, the fifth sub-operation OP23, and the seventh sub-operation OP32.

After that, the recovery handler RCVH may determine, as the reissue sub-operations, the fourth sub-operation OP22 corresponding to the first state AF among the first through seventh sub-operations OP11~OP32 stored in the issued queue list IQLST at the first time point Te, based on the issue information stored in the communication queue CMQ and the state information of the lower-level controller NMCORE and the memory interface 150 that are backed-up. The recovery handler RCVH may determine, as the reissue sub-operations, the second sub-operation OP12 and the fifth sub-operation OP23 corresponding to the second state BF and included in the first issued operation OP1 and the second issued operation OP2 including sub-operations OP11 and OP22 that are started or completed already.

The recovery handler RCVH may determine, as the cancel sub-operations, the sixth and seventh sub-operations OP31 and OP32 of the third issued operation OP3 that is not started yet.

After the reset operation of the lower-level controller NMCORE is completed, the recovery handler RCVH may transfer the second, fourth, and fifth sub-operations OP12, OP22, and OP23 determined as the reissue sub-operations to the lower-level controller NMCORE. The lower-level controller NMCORE may store the issued queue list IQLST at the second time point Tr.

Here, the higher-level controller FCORE may transfer the fourth sub-operation OP22, in which the error is occurred, first to the lower-level controller NMCORE, and the lower-level controller NMCORE may restart the communication with the nonvolatile memory device 400 starting from the fourth sub-operation OP22. The recovery handler RCVH may store the sixth and seventh sub-operations OP31 and OP32 corresponding to the cancel sub-operations of the cancel queue list CNQLST in the input-output queue IOQ.

As such, when the issued operation in which the error occurs is a multi-stage operation, the storage controller 100 may restore the lower-level controller NMCORE to the previous state before the error is occurred such that the lower-level controller NMCORE may perform the multi-stage operation starting from the sub-operation in which the error is occurred. The latency due to the error occurrence between the host device 2000 and the storage device 3000 may be further decreased, and the user experience may be further enhanced by subdividing the sub-operation or the stage in which the error is occurred and restoring the previous states of the lower-level controller NMCORE and the memory interface 150 to start from the sub-operation in which the error is occurred.

Figure 13:
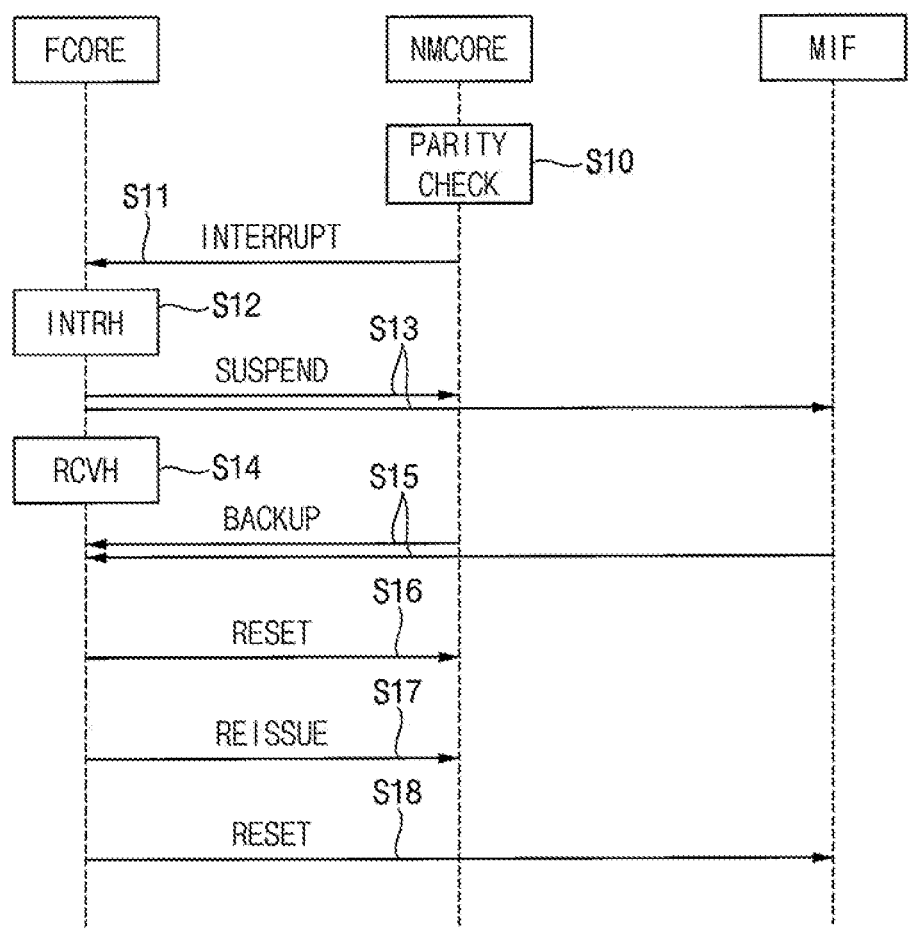
FIG. 13 is a sequence diagram illustrating an operation of a storage controller according to example embodiments.

FIG. 13 is a sequence diagram illustrating an operation of a storage controller according to example embodiments.

Referring to FIG. 13, the parity logic PTRC of the lower-level controller NMCORE may perform a parity check with respect to the operation code or the operation data that are read from the operation memory NMOM (S10), and may generate an interrupt when the parity check indicates a parity error (S11).

The interrupt handler INTRH of the higher-level controller FCORE may start in response to the interrupt (S12), and the interrupt handler INTRH may suspend the operations of the lower-level controller NMCORE and the memory interface MIF (S13).

After that, the recovery handler RCVH of the higher-level controller FCORE may start (S14), and the recovery handler RCVH may store or backup the state information of the lower-level controller NMCORE and the memory interface MIF (S15).

As described above, the recovery handler RCVH may reconfigure the issued operations of the lower-level controller NMCORE, based on the issue information stored in the communication queue CMQ and the state information of the lower-level controller NMCORE, and classify the issued operations into the reissue operations and the cancel operations.

The recovery handler RCVH may initialize the lower-level controller NMCORE, and perform the reset operation to store the operation code and the operation data in the lower-level controller after the lower-level controller NMCORE is initialized (S16). After the reset operation is completed, the recovery handler RCVH may transfer the reissue operations to the lower-level controller NMCORE (S17).

After that, the higher-level controller FCORE or the lower-level controller NMCORE may initialize the memory interface MIF, and perform the reset operation of the memory interface MIF (S18) to store, in the register MISFR of the memory interface MIF, the setting values to control the operation of the memory interface MIF and the state information corresponding to the previous state.

After the error restoring operation is completed, the storage controller 100 may restart the reissue operations with reference to the nonvolatile memory device 400.

As described above, a storage controller and a method of restoring an error of a storage controller according to example embodiments may efficiently restore an error of the lower-level controller based on the state information of the lower-level controller, and may efficiently restart the storage controller by resetting only the lower-level controller.

Hereinafter, a nonvolatile memory device included in a storage device according to example embodiments is described with reference to FIGS. 14 through 16. A NAND flash memory device is described as an example embodiment of the nonvolatile memory device, but embodiments are not limited to a particular kind of a memory device.

Figure 14:
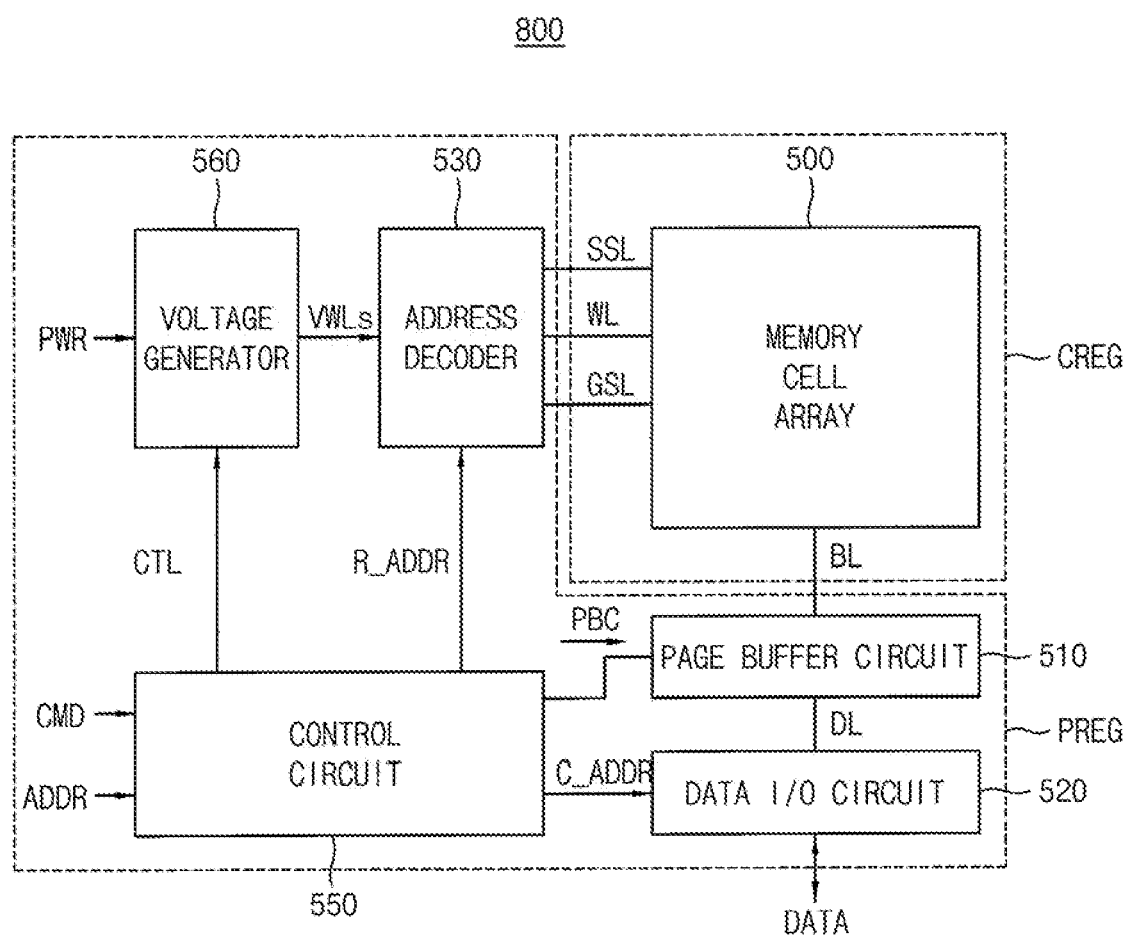
FIG. 14 is a block diagram illustrating a nonvolatile memory device included in a storage device according to example embodiments.

FIG. 14 is a block diagram illustrating a nonvolatile memory device included in a storage device according to example embodiments.

Referring to FIG. 14, a nonvolatile memory device 800 may include a memory cell array 500, a page buffer circuit 510, a data input/output (I//O) circuit 520, an address decoder 530, a control circuit 550, and a voltage generator 560. In some example embodiments, the nonvolatile memory device 800 may have a cell over periphery (COP) structure in which a memory cell array is disposed over peripheral circuits. In this case, the memory cell array 500 may be formed in a cell region CREG, and the page buffer circuit 510, the data I/O circuit 520, the address decoder 530, the control circuit 550, and the voltage generator 560 may be formed in a peripheral region PREG.

The memory cell array 500 may be coupled to the address decoder 530 through string selection lines SSL, wordlines WL, and ground selection lines GSL. The memory cell array 500 may be coupled to the page buffer circuit 510 through a bitlines BL. The memory cell array 500 may include memory cells coupled to the wordlines WL and the bitlines BL. In some example embodiments, the memory cell array 500 may be a three-dimensional memory cell array, which is formed on a substrate in a three-dimensional structure (or a vertical structure). In this case, the memory cell array 500 may include cell strings (e.g., NAND strings) that are vertically oriented such that at least one memory cell is located over another memory cell.

The control circuit 550 may receive a command signal CMD and an address signal ADDR from a memory controller, and may control erase, program, and read operations of the nonvolatile memory device 800 in response to (or based on) at least one of the command signal CMD and the address signal ADDR. The erase operation may include performing a sequence of erase loops, and the program operation may include performing a sequence of program loops. Each program loop may include a program operation and a program verification operation. Each erase loop may include an erase operation and an erase verification operation. The read operation may include a normal read operation and data recover read operation.

In an example embodiment, the control circuit 550 may generate a control signals CTL used to control the operation of the voltage generator 560, and may generate a page buffer control signal PBC for controlling the page buffer circuit 510, based on the command signal CMD, and may generate a row address R_ADDR and a column address C_ADDR based on the address signal ADDR. The control circuit 550 may provide the row address R_ADDR to the address decoder 530, and may provide the column address C_ADDR to the data I/O circuit 520.

The address decoder 530 may be coupled to the memory cell array 500 through the string selection lines SSL, the wordlines WL, and the ground selection lines GSL. During the program operation or the read operation, the address decoder 530 may determine (or select) one of the wordlines WL as a selected wordline, and may determine the remaining wordlines WL except for the selected wordline as unselected wordlines based on the row address R_ADDR.

In addition, during the program operation or the read operation, the address decoder 530 may determine one of the string selection lines SSL as a selected string selection line and determine rest of the string selection lines SSL except for the selected string selection line as unselected string selection lines based on the row address R_ADDR.

The voltage generator 560 may generate wordline voltages VWL, which are used for the operation of the memory cell array 500 of the nonvolatile memory device 800, based on the control signals CTL. The voltage generator 560 may receive the power PWR from the memory controller. The wordline voltages VWL may be applied to the wordlines WL through the address decoder 530.

In an example embodiment, during the erase operation, the voltage generator 560 may apply an erase voltage to a well and/or a common source line of a memory block, and may apply an erase permission voltage (e.g., a ground voltage) to all of the wordlines of the memory block or a portion of the wordlines based on an erase address. During the erase verification operation, the voltage generator 560 may apply an erase verification voltage simultaneously to all of the wordlines of the memory block or sequentially (e.g., one by one) to the wordlines.

In an example embodiment, during the program operation, the voltage generator 560 may apply a program voltage to the selected wordline, and may apply a program pass voltage to the unselected wordlines. During the program verification operation, the voltage generator 560 may apply a program verification voltage to the first wordline, and may apply a verification pass voltage to the unselected wordlines.

During the normal read operation, the voltage generator 560 may apply a read voltage to the selected wordline, and may apply a read pass voltage to the unselected wordlines. During the data recover read operation, the voltage generator 560 may apply the read voltage to a wordline adjacent to the selected wordline, and may apply a recover read voltage to the selected wordline.

The page buffer circuit 510 may be coupled to the memory cell array 500 through the bitlines BL. The page buffer circuit 510 may include multiple buffers. In some example embodiments, each buffer may be connected to only a single bitline. In other example embodiments, each buffer may be connected to two or more bitlines. The page buffer circuit 510 may temporarily store data to be programmed in a selected page or data read out from the selected page of the memory cell array 500.

The data I/O circuit 520 may be coupled to the page buffer circuit 510 through data lines DL. During the program operation, the data I/O circuit 520 may receive program data DATA received from the memory controller and provide the program data DATA to the page buffer circuit 510 based on the column address C_ADDR received from the control circuit 550. During the read operation, the data I/O circuit 520 may provide read data DATA, having been read from the memory cell array 500 and stored in the page buffer circuit 510, to the memory controller based on the column address C_ADDR received from the control circuit 550.

The page buffer circuit 510 and the data I/O circuit 520 may read data from a first area of the memory cell array 500, and may write this read data to a second area of the memory cell array 500 (e.g., without transmitting the data to a source external to the nonvolatile memory device 800, such as to the memory controller). Thus, the page buffer circuit 510 and the data I/O circuit 520 may perform a copy-back operation.

Figure 15:
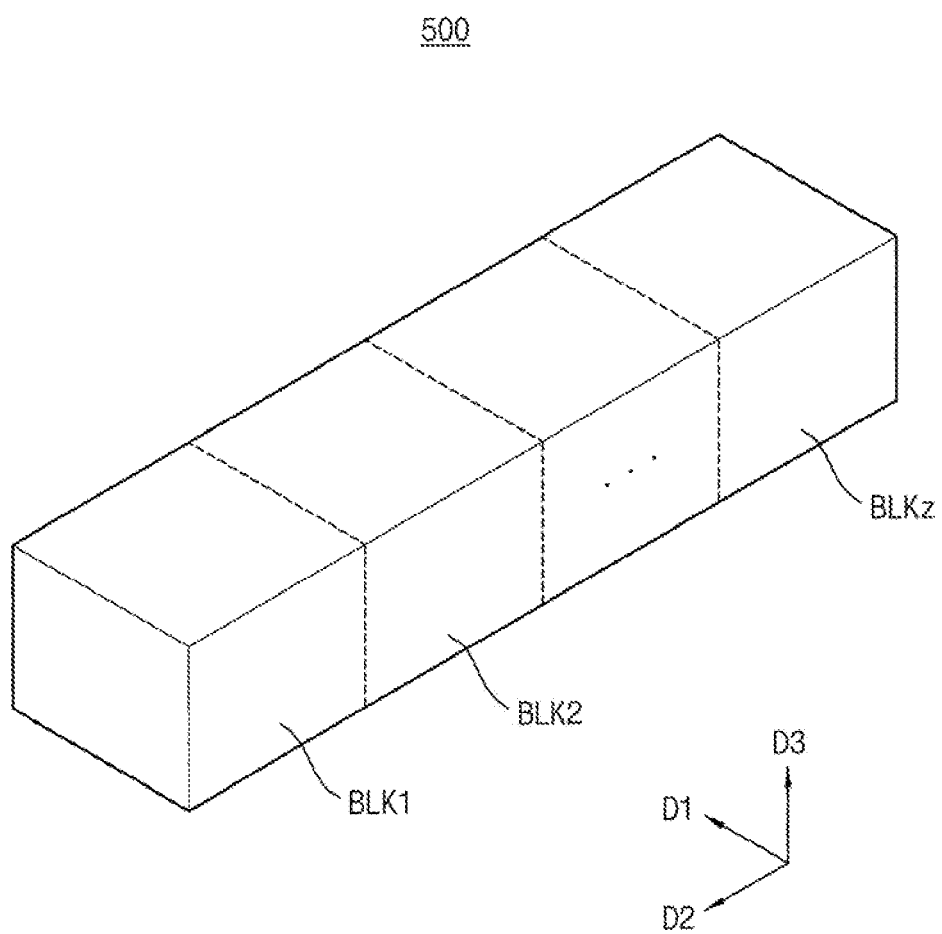
FIG. 15 is a block diagram illustrating a memory cell array included in the nonvolatile memory device of FIG. 14.
Figure 16:
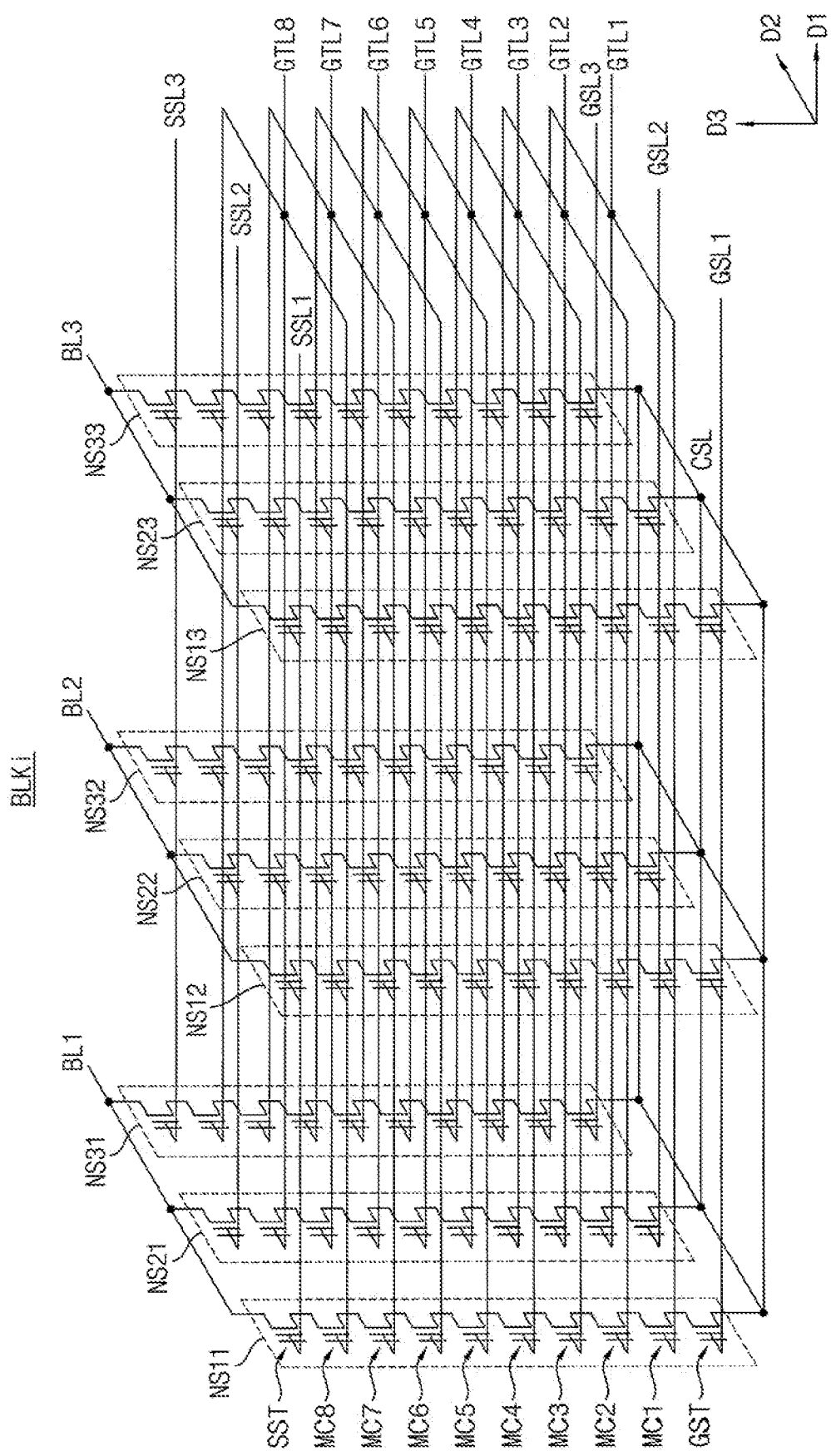
FIG. 16 is a circuit diagram illustrating an equivalent circuit of a memory block included in the memory cell array of FIG. 15.

FIG. 15 is a block diagram illustrating a memory cell array included in the nonvolatile memory device of FIG. 14, and FIG. 16 is a circuit diagram illustrating an equivalent circuit of a memory block included in the memory cell array of FIG. 15.

Referring to FIG. 15, the memory cell array 500 may include memory blocks BLK1 to BLKz. In some example embodiments, the memory blocks BLK1 to BLKz may be selected by the address decoder 530 of FIG. 14. For example, the address decoder 530 may select a particular memory block BLK corresponding to a block address among the memory blocks BLK1 to BLKz.

A memory block BLKi of FIG. 16 may be formed on a substrate in a three-dimensional structure (or a vertical structure). For example, NAND strings or cell strings included in the memory block BLKi may be formed in a vertical direction D3 perpendicular to an upper surface of a substrate.

Referring to FIG. 16, the memory block BLKi may include NAND strings NS11 to NS33 coupled between bitlines BL1, BL2, and BL3 and a common source line CSL. Each of the NAND strings NS11 to NS33 may include a string selection transistor SST, a memory cells MC1 to MC8, and a ground selection transistor GST. In FIG. 16, each of the NAND strings NS11 to NS33 is illustrated to include eight memory cells MC1 to MC8. However, embodiments are not limited thereto, and each of the NAND strings NS11 to NS33 may include various numbers of memory cells.

Each string selection transistor SST may be connected to a corresponding string selection line (one of SSL1 to SSL3). The memory cells MC1 to MC8 may be connected to corresponding gate lines GTL1 to GTL8, respectively. The gate lines GTL1 to GTL8 may be wordlines, and some of the gate lines GTL1 to GTL8 may be dummy wordlines. Each ground selection transistor GST may be connected to a corresponding ground selection line (one of GSL1 to GSL3). Each string selection transistor SST may be connected to a corresponding bitline (e.g., one of BL1, BL2, and BL3), and each ground selection transistor GST may be connected to the common source line CSL.

Wordlines (e.g., WL1) having the same height may be commonly connected, and the ground selection lines GSL1 to GSL3 and the string selection lines SSL1 to SSL3 may be separated. In FIG. 16, the memory block BLKi is illustrated as being coupled to eight gate lines GTL1 to GTL8 and three bitlines BL1 to BL3. However, embodiments are not limited thereto, and each memory block in the memory cell array 500 may be coupled to various numbers of wordlines and various numbers of bitlines.

Figure 17:
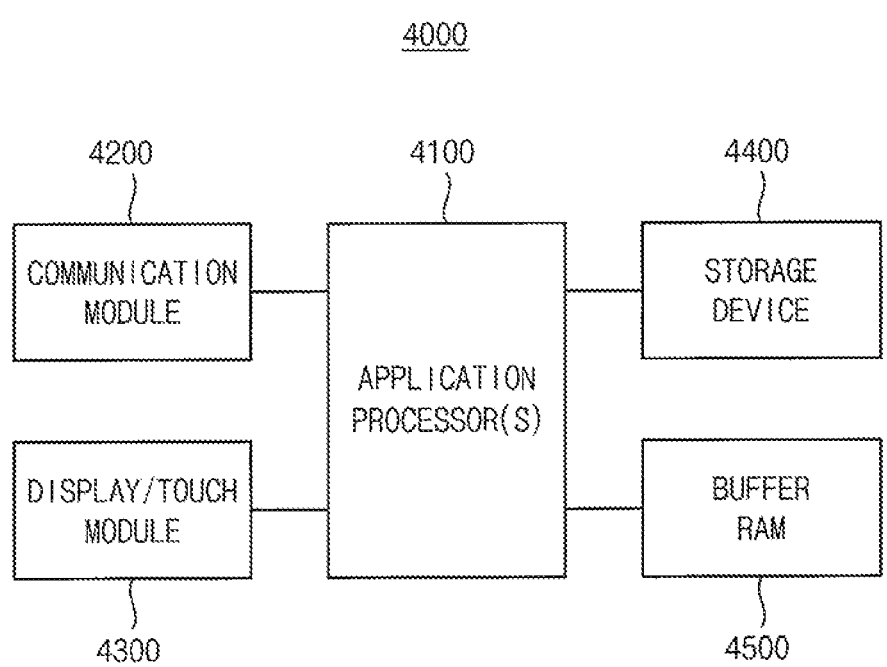
FIG. 17 is a block diagram illustrating an electronic device according to example embodiments.

FIG. 17 is a block diagram illustrating an electronic device according to example embodiments.

Referring to FIG. 17, an electronic device 4000 may include an application processor 4100, a communication module 4200, a display/touch module 4300, a storage device 4400, and a buffer RAM 4500.

The application processor 4100 may control operations of the electronic device 4000.

The communication module 4200 may be implemented to perform wireless or wired communications with an external device.

The display/touch module 4300 may be implemented to display data processed by the application processor 4100 or to receive data through a touch panel.

The storage device 4400 may be implemented to store user data. The storage device 4400 may be a solid state drive (SSD), an embedded multimedia card (eMMC), a universal flash storage (UFS), etc. As described above, the storage device 4400 may include a higher-level controller FCORE and a lower-level controller NMCORE and, when an error occurs in the lower-level controller NMCORE, the lower-level controller NMCORE may be restored, under control of the higher-level controller FCORE, to a previous state before the error is occurred.

The buffer RAM 4500 may temporarily store data used for processing operations of the electronic device 4000. For example, the buffer RAM may be a dynamic random access memory (DRAM) such as a DDR (double data rate) SDRAM, (synchronous DRAM), a GDDR (graphics DDR) DRAM, an RDRAM (Rambus DRAM), etc.

As described above, a storage controller and a method of restoring an error of a storage controller according to example embodiments may efficiently restore an error of a lower-level controller based on state information of the lower-level controller, and may efficiently restart the storage controller by resetting only the lower-level controller.

Example embodiments may be embodied as a system, method, computer program product, or a computer program product embodied in one or more computer readable. e.g., tangible, medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device.

Embodiments may be applied to various electronic devices and systems. For example, embodiments may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an vehicle automotive system, etc.

As described above, example embodiments may provide a storage controller including a higher-level controller and a lower-level controller, capable of efficiently restoring an error of the lower-level controller and restarting the storage controller.

Example embodiments may provide a method of restoring an error of a storage controller including a higher-level controller and a lower-level controller, capable of efficiently restoring an error of the lower-level controller and restarting the storage controller.

A storage controller and a method of restoring error of a storage controller according to example embodiments may efficiently restore an error of the lower-level controller based on the state information of the lower-level controller, and may efficiently restart the storage controller by resetting only the lower-level controller.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A storage controller, comprising:
   a host interface configured to perform communication with a host device;
   a memory interface configured to perform communication with a nonvolatile memory device;
   a higher-level controller configured to issue operations to be performed by the nonvolatile memory device based on requests transferred through the host interface; and
   a lower-level controller including an operation memory configured to store an operation code and operation data, the lower-level controller configured to control the memory interface based on the operation code and the operation data such that the nonvolatile memory device performs issued operations received from the higher-level controller,
   wherein the higher-level controller is configured to perform, when an error occurs in the lower-level controller, an error restoring operation based on state information of the lower-level controller, the error restoring operation restoring the lower-level controller to a previous state corresponding to a state before the error occurred.

2. The storage controller as claimed in claim 1, wherein the higher-level controller and the lower-level controller are implemented with distinct processor cores.

3. The storage controller as claimed in claim 1, wherein, during the error restoring operation only the lower-level controller is reset, and the higher-level controller operates normally without reset.

4. The storage controller as claimed in claim 1, wherein:
   the lower-level controller is configured to generate parity bits corresponding to the operation code and the operation data, and to store the parity bits with the operation code and the operation data in the operation memory, and
   the lower-level controller is configured to perform a parity check with respect to the operation code or the operation data based on the parity bits that are read with the operation code or the operation data from the operation memory, and to generate an interrupt, which indicates the error in the lower-level controller, when the parity check indicates a parity error.

5. The storage controller as claimed in claim 1, wherein:
   the lower-level controller is configured to perform a parity check with respect to the operation code or the operation data that are read from the operation memory, and to generate an interrupt, which indicates the error in the lower-level controller, when the parity check indicates a parity error, and
   the higher-level controller is configured to suspend an operation of the lower-level controller in response to the interrupt from the lower-level controller, and to store state information of the lower-level controller.

6. The storage controller as claimed in claim 5, wherein the higher-level controller is configured to store a communication queue including issue information on the issued operations that are transferred to the lower-level controller, and determine reissue operations to be transferred again to the lower-level controller among the issued operations based on the issue information and the state information of the lower-level controller.

7. The storage controller as claimed in claim 6, wherein:
the higher-level controller is configured to perform a reset operation, the reset operation storing the operation code and the operation data in the lower-level controller after the lower-level controller is initialized, and to transfer the reissue operations to the lower-level controller after the reset operation is completed, and
the lower-level controller is configured to perform the reissue operations received from the higher-level controller after the reset operation is completed.

8. The storage controller as claimed in claim 6, wherein the higher-level controller is configured to determine cancel operations among the issued operations except the reissue operations based on the issue information and the state information of the lower-level controller.

9. The storage controller as claimed in claim 8, wherein the higher-level controller is configured to store an input-output queue including wait operations to be transferred to the lower-level controller, and to store the cancel operations in the input-output queue.

10. The storage controller as claimed in claim 6, wherein the higher-level controller is configured to suspend an operation of the memory interface in response to the interrupt from the lower-level controller, and to store state information of the memory interface.

11. The storage controller as claimed in claim 10, wherein:
the issued operation in which the error occurred corresponds to a multi-stage operation including a plurality of sub-operations to be performed sequentially by the nonvolatile memory device, and
the higher-level controller is configured to determine a target sub-operation in which the error occurred among the plurality of sub-operations based on the state information of the memory interface.

12. The storage controller as claimed in claim 11, wherein:
the higher-level controller is configured to perform a reset operation, the reset operation storing the operation code and the operation data in the lower-level controller, after the lower-level controller is initialized, and to transfer reissue sub-operations that are not completed among the plurality of sub-operations to the lower-level controller after the reset operation is completed, and
the lower-level controller is configured to perform the reissue sub-operations received from the higher-level controller after the reset operation is completed.

13. The storage controller as claimed in claim 11, wherein the higher-level controller is configured to restore the lower-level controller to the previous state such that the multi-stage operation is performed starting from the target sub-operation.

14. A method of restoring an error of a storage controller that includes a higher-level controller and a lower-level controller, the lower-level controller including an operation memory, which stores an operation code and an operation data, and being configured to control a memory interface, which performs communication with a nonvolatile memory device, based on the operation code and the operation data such that the nonvolatile memory device performs issued operations received from the higher-level controller, the method comprising:
generating, by the lower-level controller, an interrupt when an error occurs in the lower-level controller;
suspending, by the higher-level controller, an operation of the lower-level controller in response to the interrupt from the lower-level controller, and storing state information of the lower-level controller; and
performing, by the higher-level controller, an error restoring operation based on the state information of the lower-level controller, the error restoring operation restoring the lower-level controller to a previous state that corresponds to a state before the error occurs.

15. The method as claimed in claim 14, wherein, during the error restoring operation only the lower-level controller is reset, and the higher-level controller operates normally without reset.

16. The method as claimed in claim 14, wherein generating the interrupt includes:
performing a parity check with respect to the operation code or the operation data that are read from the operation memory; and
generating the interrupt when the parity check indicates a parity error.

17. The method as claimed in claim 14, wherein performing the error restoring operation includes:
storing a communication queue that includes issue information on the issued operations that are transferred to the lower-level controller; and
determining reissue operations to be transferred again to the lower-level controller among the issued operations and determining cancel operations among the issued operations except the reissue operations, based on the issue information and the state information of the lower-level controller.

18. The method as claimed in claim 17, further comprising:
suspending, by the higher-level controller, an operation of the memory interface in response to the interrupt from the lower-level controller; and
storing state information of the memory interface.

19. The method as claimed in claim 14, wherein:
the issued operation in which the error occurred corresponds to a multi-stage operation that includes a plurality of sub-operations to be performed sequentially by the nonvolatile memory device, and
performing the error restoring operation includes:
determining, by the higher-level controller, a target sub-operation in which the error occurred among the plurality of sub-operations based on the state information of the memory interface;
performing, by the higher-level controller, a reset operation, the reset operation storing the operation code and the operation data in the lower-level controller after the lower-level controller is initialized;
transferring reissue sub-operations that are not completed among the plurality of sub-operations to the lower-level controller after the reset operation is completed; and
performing, by the lower-level controller, the reissue sub-operations received from the higher-level controller after the reset operation is completed.

20. A method of restoring an error of a storage controller including a higher-level controller and a lower-level controller, the lower-level controller including an operation memory, which stores an operation code and an operation data, and being configured to control a memory interface, which performs communication with a nonvolatile memory device, based on the operation code and the operation data such that the nonvolatile memory device performs issued operations received from the higher-level controller, the method comprising:

generating, by the lower-level controller, an interrupt when an error occurs in the lower-level controller;

suspending, by the higher-level controller, an operation of the lower-level controller and an operation of the memory interface in response to the interrupt from the lower-level controller, and storing first state information of the lower-level controller and a second state information of the memory interface; and performing, by the higher-level controller, an error restoring operation based on the first state information of the lower-level controller and the second state information of the memory interface, the restoring operation restoring the lower-level controller and the memory interface to previous states corresponding to states before the error occurs.

* * * * *